United States Patent
Miyamoto et al.

(10) Patent No.: US 6,271,065 B1
(45) Date of Patent: *Aug. 7, 2001

(54) METHOD DIRECTED TO THE MANUFACTURE OF AN SOI DEVICE

(75) Inventors: Shoichi Miyamoto; Takashi Ipposhi, both of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/494,352

(22) Filed: Jan. 31, 2000

Related U.S. Application Data

(62) Division of application No. 08/671,542, filed on Jun. 27, 1996, now Pat. No. 6,064,090.

(30) Foreign Application Priority Data

Jan. 17, 1996 (JP) .......................................... 8-5712

(51) Int. Cl.$^7$ .................................................. H01L 21/00
(52) U.S. Cl. .......................... 438/164; 438/149; 438/163; 438/165; 438/151
(58) Field of Search .................... 438/149, 150, 438/151, 152, 153, 154, 155, 156, 157, 158, 159, 160, 161, 162, 163, 164

(56) References Cited

U.S. PATENT DOCUMENTS

| | | | |
|---|---|---|---|
| 4,648,173 | * 3/1987 | Malaviya | 29/576 |
| 4,753,986 | 6/1988 | Matloubian . | |
| 4,784,971 | * 11/1988 | Chiu et al. | 437/57 |
| 5,102,809 | * 4/1992 | Eklund et al. | 437/21 |
| 5,477,073 | * 12/1995 | Wakai et al. | 257/347 |
| 5,482,871 | * 1/1996 | Pollack | 437/21 |
| 5,592,008 | * 1/1997 | Yamazaki et al. | 257/347 |
| 5,596,205 | * 1/1997 | Reedy et al. | 257/347 |
| 5,693,549 | * 12/1997 | Kim | 438/40 |
| 5,702,986 | * 12/1997 | Mathews et al. | 438/163 |
| 5,763,904 | * 6/1998 | Nakajima et al. | 257/347 |

FOREIGN PATENT DOCUMENTS

| | | | |
|---|---|---|---|
| 60 258957 | 12/1985 | (JP) . | |
| 404239117 A | 8/1992 | (JP) . | |
| 404239177 A | * 8/1992 | (JP) | 257/347 |
| 405114735 | * 5/1993 | (JP) | 257/347 |
| 405343430 A | * 12/1993 | (JP) | 257/347 |

* cited by examiner

Primary Examiner—John F. Niebling
Assistant Examiner—Viktor Simkovic
(74) Attorney, Agent, or Firm—Oblon, Spivak, McClelland, Maier & Neustadt, P.C.

(57) ABSTRACT

On an insulating film a mesa-isolation silicon layer is formed, in which a channel region and source/drain regions ar included. A gate insulating film and a conducting layer as a part of a gate electrode are stacked on the mesa-isolation silicon layer. A sidewall of an insulating material is formed on side surfaces of the mesa-isolation silicon layer, gate insulating film, and conducting layer at an end portion of the channel region of the mesa-isolation silicon layer, and a gate electrode is formed on the conducting layer.

18 Claims, 14 Drawing Sheets

METHOD DIRECTED TO THE MANUFACTURE OF AN SOI DEVICE

This application is a Division of application Ser. No. 08/671,542 Filed on Jun. 27, 1996 now U.S. Pat. No. 6,064,090.

BACKGROUND OF THE INVENTION

1. Field of the Invention

The present invention relates to a semiconductor device having an SOI structure including a mesa-isolation transistor, and a method of manufacturing the device.

2. Description of the Background Art

In a semiconductor device having an SOI structure, a structure is known in which a side wall is formed on a side surface of an SOI layer as an active region to mesa-isolate the SOI layer (See, for example, Japanese Patent Laid-open No. 60-258957.)

FIG. 30 is a cross section taken along a gate length of a mesa-isolation MOS transistor having an SOI structure in a conventional semiconductor device, which includes a structure shown in Japanese Patent Laid-open No. Sho 60-258957.

Referring to FIG. 30, the mesa-isolation MOS transistor comprises a silicon substrate 101, a buried oxide film 102 formed on the upper surface of the silicon substrate 101, a mesa-isolation SOI layer 103 formed on the buried oxide film 102, and N-type high-concentration impurity regions 119, N-type low-concentration impurity region 117, a channel region 123 formed in the SOI layer 103 and N-type source/drain regions 121 constituting an N-channel transistor. The N-type low-concentration impurity regions 117 and the N-type high-concentration impurity regions 119 adjacent to the N-type low concentration impurity regions 117 formed respectively on the opposite sides of the channel region 123 constitute N-type source/drain regions 121. Similarly, P-type source/drain regions 122, each including a P-type high-concentration impurity region 120 and a P-type low-concentration impurity region 118, and a channel region 124 are formed in the other SOI layer 103 constituting a P-channel transistor.

A gate electrode 110 is formed over each channel region 123, 124 with a gate insulating film 104b therebetween, and a sidewall 111 of an insulating material is formed by deposition on a side surface of the gate electrode 110. A P-type high-concentration impurity region 107 is formed in each N-type high concentration impurity region 119 at its end portion, and an oxide film 109 is formed on a side surface of the SOI layer 103. Further, a sidewall 108 of an oxide film is formed on a side surface of the oxide film 109 of each N-type high concentration impurity region 119. A plurality of wirings 113b of aluminum, or the like patterned on the interlayer insulating film 112 are respectively connected to the N-type and P-type source/drain regions 121 and 122 via contacts 113a through the interlayer insulating film.

FIG. 31 is a top plan view of the semiconductor device shown in FIG. 30. FIG. 30 is a cross section taken along the line A—A in FIG. 31, and FIG. 32 is a cross section taken along the line C—C in FIG. 31.

A manufacturing method for the semiconductor device shown in FIGS. 30 to 32 will now be described. As shown in FIG. 33 a buried oxide film 102 is first formed on the upper surface of a silicon substrate 101, and an SOI layer 103 is next formed on the buried oxide film 102. As shown in FIG. 34, an oxide film 104a is next stacked on the SOI layer 103, and a silicon nitride film 106 is next stacked on the oxide film 104a. Thereafter, the silicon nitride film 106 is etched by using a resist pattern 114 as an etching mask.

As shown in FIG. 35, a resist pattern 115 is next formed on only a P-channel transistor forming region, and boron ions are then implanted into the SOI layer 103 to thereby selectively form a P-type high concentration impurity region 107 in an N-channel transistor forming region.

As shown in FIG. 36, the resist patterns 114 and 115 are next removed. Thereafter, a silicon nitride film is formed on the whole surface of the substrate, and is then etched back to leave a sidewall 116 of this silicon nitride film on a surface of the silicon nitride film 106. Then, anisotropic etching of the SOI layer 103 is performed by using the silicon nitride film 106 and the sidewall 116 as a mask and using the buried oxide film 102 as an etching stopper.

As shown in FIG. 37, thermal oxidation is next performed to form an oxide film 109 on the exposed side surface of the SOI layer 103. Thereafter, the silicon nitride film 106 and the sidewall 116 are etched away. A silicon oxide film having a given thickness is next formed on the whole surface of the substrate, and anisotropic etching is performed by using the SOI layer 103 as an etching mask to form a sidewall 108.

Thereafter, gate insulating films 104b, gate electrodes 110, sidewalls 111, an interlayer insulating film 112, contacts 113a, and wirings 113b of aluminum or the like are formed to thereby obtain the semiconductor device as shown in FIGS. 30 to 32.

In the semiconductor device formed by this method, the upper surface of the SOI layer 103 is damaged by the anisotropic etching which forms the sidewall 108. Accordingly, in the conventional transistor having a structure in which a sidewall is formed on the side surface of an SOI layer, it is difficult to ensure the reliability of the gate insulating film 104b formed by thermally oxidizing the upper surface of the SOI layer 103 having an etching damage.

Further, the sidewall 108 is deposited on only the side surface of the SOI layer 103. Accordingly, the thickness of a portion of the sidewall 108 formed in the vicinity of an upper edge portion of the SOI layer 103 as shown by symbols A in FIG. 32 is much smaller than the thickness of the remaining portion of the sidewall 108. As a result, the distance between the SOI layer 103 and the gate electrode 110 at the upper edge portion of the SOI layer 103 is small, causing a possibility of electric filed concentration and current leakage between the source and drain electrodes.

SUMMARY OF THE INVENTION

The present invention overcomes the above-mentioned drawbacks of the conventional art and it is the purpose of this invention to provide a semiconductor device of a SOI mesa-isolation structure having stable characteristics with suppressed source/drain leak current.

One aspect of the present invention is a semiconductor device including a mesa-isolation silicon layer, formed on an insulating film in which a channel region and source/drain regions are formed. A gate insulating film is formed on the mesa-isolation silicon layer. A conducting layer is formed on the gate insulating film. A sidewall of an insulating material is formed on side surfaces of the mesa-isolation silicon layer, the gate insulating film, and the conducting layer at an end portion of the channel region of the mesa-isolation silicon layer. And a gate electrode is formed on the conducting layer.

Another aspect of the present invention is a semiconductor device as stated above, in which the conducting layer is smaller in area than the gate insulating film.

A further aspect of the present invention is a manufacturing method for a semiconductor device in which an SOI layer, a gate insulating film and a conducting layer, each having a certain thickness, are sequentially stacked on an insulating film. An anisotropic etching is performed by using a predetermined mask pattern to form stacked layers with the same area from the SOI layer, the gate insulating film, and the conducting layer. Side surfaces of at least the SOI layer and the conducting layer are oxidized. The mask pattern is removed. An insulating material is deposited on the insulating film and then anisotropic etching is performed to form a sidewall on the oxidized side surfaces of the SOI layer and the conducting layer. A gate electrode is then formed in contact with the conducting layer.

Another aspect of the present invention is a manufacturing method for a semiconductor device in which an SOI layer, a gate insulating film, a conducting layer, and a nitride film, each having a certain thickness, are sequentially stacked on an insulating film. An anisotropic etching is performed by using a predetermined mask pattern to form stacked layers with the same area from the nitride film and the conducting layer. At least the SOI layer and the conducting layer are selectively oxidized. A first sidewall of nitride film is formed on a side surface of at least the nitride film. Anisotropic etching of the gate insulating film and the first sidewall as an etching mask. A side surface of the SOI layer is oxidized. The nitride film and the first sidewall are etched away. An insulating material is deposited on the insulating film and next anisotropic etching is performed to form a second sidewall on the side surface of the SOI layer and a side surface of the conducting layer. A gate electrode is then formed in contact with the conducting layer.

Another aspect of the present invention is a manufacturing method for a semiconductor device in which an SOI layer, a gate insulating film, a first conducting layer, a nitride film, and a second conducting layer, each having a certain thickness, are sequentially stacked on an insulating film. An anisotropic etching is performed by using a predetermined mask pattern to form stacked layers with the same area from the first conducting layer, the nitride film, and the second conducting layer. At least the SOI layer, the first conducting layer, and the second conducting layer are selectively oxidized. A first sidewall of nitride film is formed on a side surface of at least the nitride film. Anisotropic etching of the second conducting layer, the gate insulating film, and the SOI layer is performing by using the nitride film and the first sidewall as an etching mask. A side surface of the SOI layer is oxidized. The nitride film and the first sidewall are etched away. An insulating material is deposited on the insulating film and next anisotropic etching is performed to form a second sidewall on the side surface of the SOI layer and a side surface of the first conducting layer. A gate electrode is then formed in contact with the first conducting layer.

Other features and advantages of the present invention will become more apparent from the following description taken together with the accompanying drawings.

DETAILED DESCRIPTION OF THE PREFERRED EMBODIMENTS

This invention will be described in further detail by way of example with reference to the accompanying drawings.

First Preferred Embodiment

Figure 1:
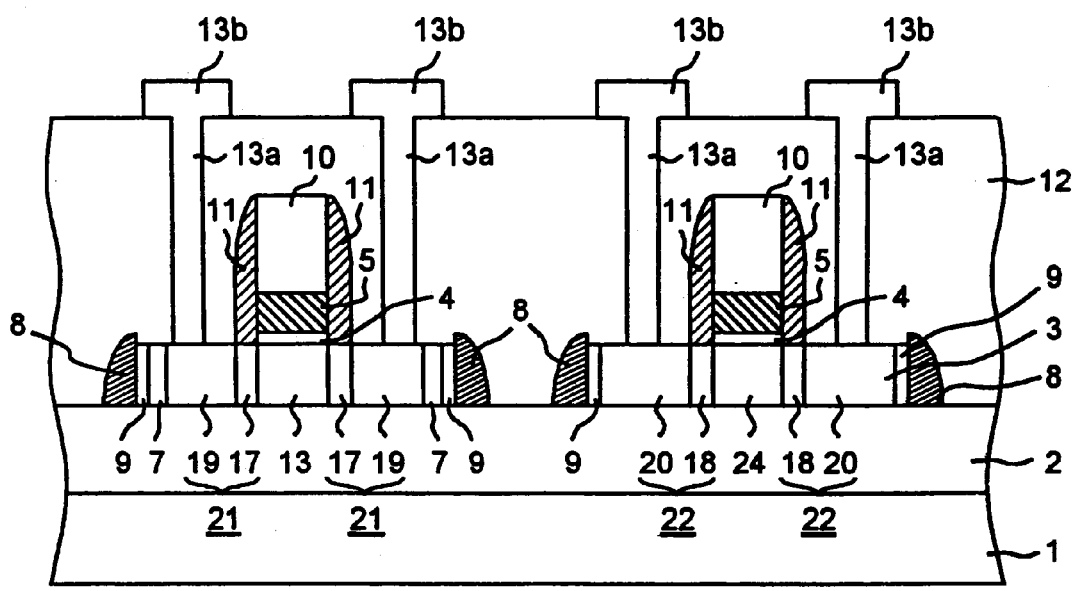
FIG. 1 shows a cross sectional view of a semiconductor device according to a first embodiment of this invention.

A first preferred embodiment of the present invention will now be described with reference to the drawings. FIG. 1 shows a cross section of a MOS transistor as a semiconductor device according to the first preferred embodiment, taken along a gate length of the MOS transistor.

Referring to FIG. 1, the MOS transistor includes a silicon substrate 1, a buried oxide film 2 formed on the upper surface of the silicon substrate 1 and a mesa-isolation SOI layer 3. A gate insulating film 4 is formed of a silicon oxide film having a thickness of about 100 Å and is formed on each of channel regions 23 and 24 in the SOI layer 3. A conducting layer 5 of polysilicon is formed on the gate insulating film 4 to constitute a part of a gate electrode.

A P-type high-concentration impurity region 7 is formed in the side surface of the SOI layer 3 in an N-channel transistor forming region. An oxide film 9 is formed by heat treatment of the side surface of the SOI layer 3.

A sidewall 8 of an insulating material such as silicon oxide is formed by deposition on a side surface of the SOI layer 3 so a to vertically extend from the upper surface of the conducting layer 5 to the lower surface of the SOI layer 3. A gate electrode 10 of polysilicon is formed and a sidewall 11 of an insulating material such as silicon oxide is formed by deposition on side surfaces of the gate electrode 10 and the conducting layer 5. An interlayer insulating film 12 is formed and a contact 13 is formed between the interlayer insulating film 12, for electrically connecting the SOI layer 3 of the gate electrode 10 and a wiring 13b of aluminum or the like formed on the interlayer insulating film 12.

Further, each of N-type source/drain regions 21 having an LDD structure includes an N-type low-concentration impurity region 17 and an N-type high-concentration impurity region 19, and each of the P-type source/drain regions 22 having an LDD structure includes a P-type low-concentration impurity region 18 and a P-type high-concentration impurity region 20.

Figure 2:
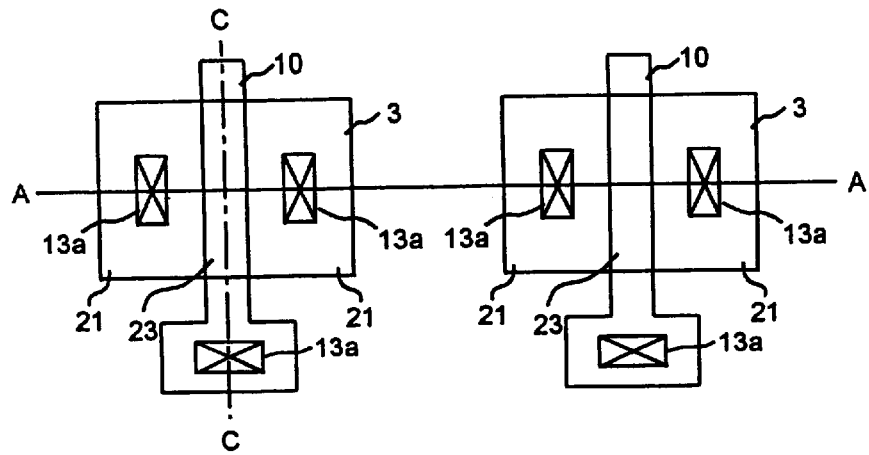
FIG. 2 shows a plan view of a semiconductor device according to a first embodiment of this invention.
Figure 3:
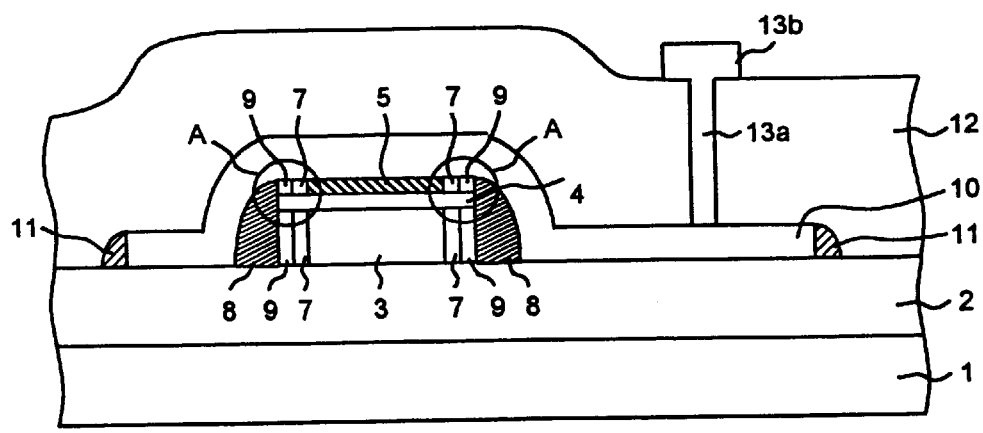
FIG. 3 shows a cross sectional view of a semiconductor device according to a first embodiment of this invention.

FIG. 2 is a top plan view of the semiconductor device shown in FIG. 1, and FIG. 1 is a cross section taken along the line A—A in FIG. 2. FIG. 3 is a cross section taken along the line C—C in FIG. 2. In FIGS. 2 and 3, the same reference numerals as those shown in FIG. 1 denote the same or corresponding parts.

The semiconductor device shown in FIGS. 1 to 3 is characterized in that the conducting layer 5 is formed between the gate electrode 10 and the gate insulating film 4 and in that the sidewall 8 is not formed as an insulating film 4 and in the that sidewall 8 is not formed as an insulating film with the same height as that of the SOI layer 3, but is formed with a height between the upper surface of the conducting layer 5 which acts as a part of the gate electrode and the lower surface of the SOI layer 3.

Now, a manufacturing method for the semiconductor device shown in FIGS. 1 to 3 will be described.

Figure 4:
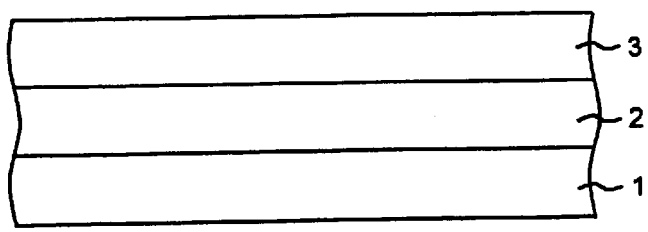
FIGS. 4–12 illustrate a method of manufacturing a semiconductor device according to a first embodiment of this invention.

As shown in FIG. 4, an SOI substrate is first formed by forming a buried oxide film 2 on an upper surface of a silicon substrate 1 and then stacking an SOI layer 3 on the buried oxide film 2. The buried oxide film 2 may be formed by any techniques such as a SIMOX process in which oxygen ions are implanted into the silicon substrate 1 and heat treatment is then performed to form a silicon oxide film. A wafer boding process may also be implemented. Thus, the method of forming the SOI substrate is not limited.

Further, after forming the SOI layer 3, P-type impurities are implanted into a portion corresponding to a channel in an N-channel transistor forming region and N-type impurities are implanted into a portion corresponding to a channel in a P-channel transistor forming region and impurity control is performed.

Figure 5:
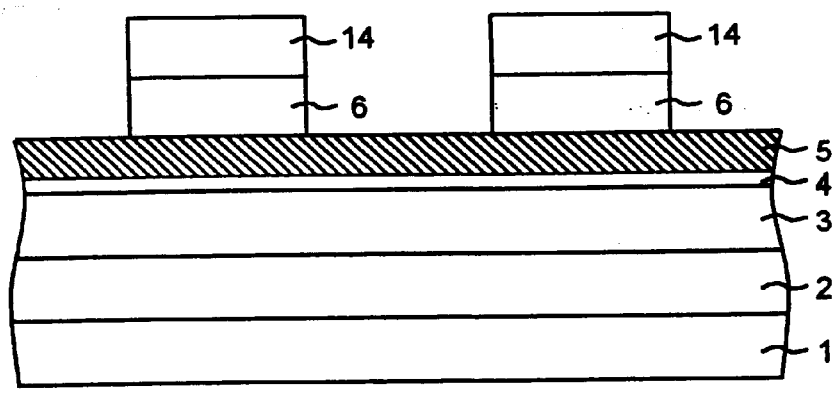

As shown in FIG. 5, an oxide film 4 is formed on the SOI layer 3 by deposition at about 800° C. or by oxidation of the upper surface of the SOI layer 3 to form a gate insulating film 4 having a thickness of about 100 Å. A conducting layer 5 of polysilicon having a thickness of 200 Å is next stacked on the gate insulating film 4. A nitride film 6 having a thickness of about 1000 Å is next stacked on the conducting layer 5, and a resist pattern 14 as a mask for patterning the nitride film 6 is next formed on the nitride film 6 by photolithography. Thereafter, anisotropic etching of the nitride film 6 is performed by using the resist pattern 14 as etching mask to thereby obtain the same area of the nitride film 6 as that of the resist pattern 14.

Figure 6:
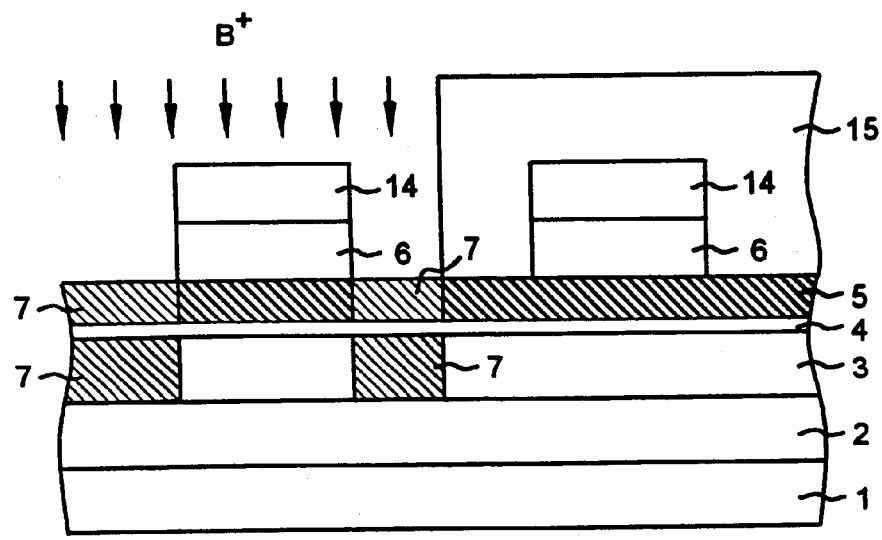

As shown in FIG. 6, a resist pattern 15 is next formed so as to cover the P-channel transistor forming region, that is, a right half region as viewed in FIG. 6, and boron ions are next implanted into the N-channel transistor forming region, that is, a left half region as viewed in FIG. 6, with energies of 10–20 kev and doses of $3–15\times10^{13}$ cm$^{-2}$ to thereby selectively form a P-type high-concentration impurity region 7 in the SOI layer 3 and in the conducting layer 5. The P-type high-concentration impurity region 7 serves to suppress current leakage between source and drain electrodes due to a phenomenon that the impurities may be drawn out by heat treatment or the like in the subsequent steps at a portion shown by symbols A in FIG. 3 in the SOI layer 3 of the N-channel transistor, causing a reduction in impurity concentration and the concentration and the occurrence of channel depletion at a low voltage.

Figure 7:
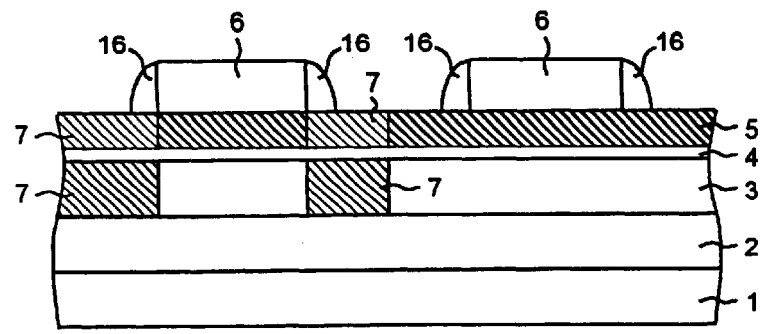

As shown in FIG. 7, the resist patterns 14 and 15 are next removed. Thereafter, a nitride film having a thickness of about 1000 Å is stacked, and anisotropic dry etching is then performed by using the conducting layer 5 as an etching stopper to thereby form a sidewall 16 from this nitride film on the side surface of the nitride film 6.

Figure 8:
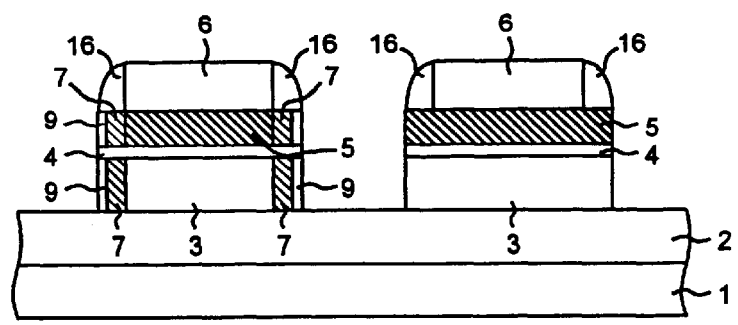

As shown in FIG. 8, anisotropic dry etching is next performed by using the nitride film 6 and the sidewall 16 of the above nitride film as an etching mask to sequentially pattern the conducing layer 5, the gate insulating film 4, and the SOI layer 3. The side surfaces of the SOI layer 3 and the conducting layer 5 patterned above are next subjected to thermal oxidation to form a thermally oxidized film 9, thereby eliminating an etching damage generated on the side surfaces of the SOI layer 3 and the conducting layer 5 by the anisotropic dry etching.

Figure 9:
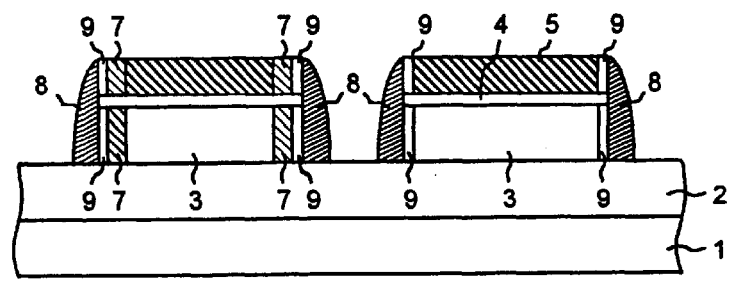

As shown in FIG. 9, the nitride film 6 and the sidewall 16 are next removed by wed etching. Therefore, a silicon oxide film having a thickness of 1500 Å is stacked on the entire surface of the substrate, and anisotropic dry etching is performed to form a sidewall 8 from this silicon oxide film on the sectional side surfaces of the conducting layer 5, the gate insulating film 4, and the SOI layer 3. The extent of the anisotropic dry etching at this time is such that the upper surface of the conducting layer 5 may be removed, but the conducting layer 5 must not be completely removed until the etching reaches the upper surface of the gate insulating film 4. While impurity control is performed by implanting impurity ions into the regions corresponding to the channels after forming the SOI layer 3 and before an element isolation process as mentioned above, the impurity control in the regions corresponding to the channels in the SOI layer 3 may be performed after the element isolation process by implanting P-type impurity ions and N-type impurity ions into the SOI layer 3 in the N-channel transistor forming region and the P-channel transistor forming region, respectively.

Figure 10:
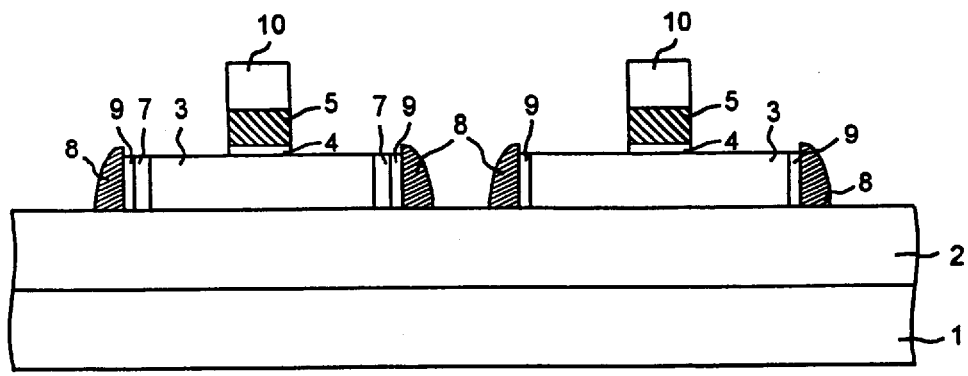
Figure 11:
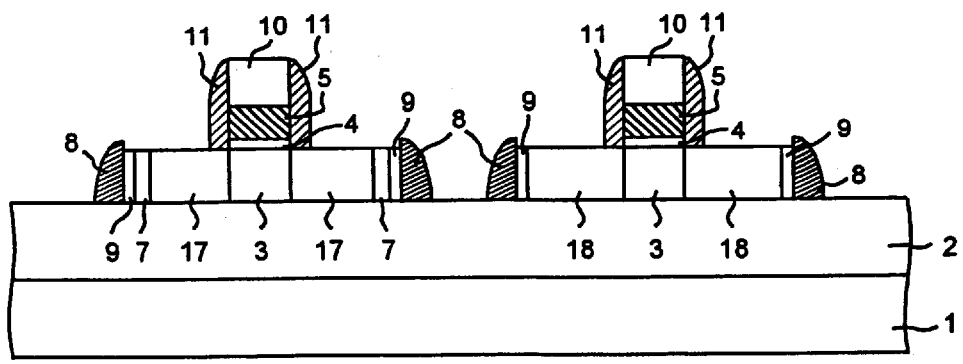

As shown in FIG. 10, a gate electrode 10 of a conducting material such as polysilicon is patterned, and the conducting layer 5 and the gate insulating film 4 are also patterned so as to have the same size as that of the gate electrode 10. As shown in FIG. 11, N-type impurity ions are implanted into the N-channel transistor forming region and P-type impurity ions are implanted into the P-channel transistor forming region to thereby respectively form N-type and P-type low-concentration impurity regions 17 and 18 each for forming source/drain regions having an LDD structure. Thereafter, an insulating film is stacked on the entire surface of the substrate, and anisotropic etching is performed to form a sidewall 11 on the side surfaces of the gate electrode 10, the conducing layer 5, and the gate insulating film 4.

Figure 12:
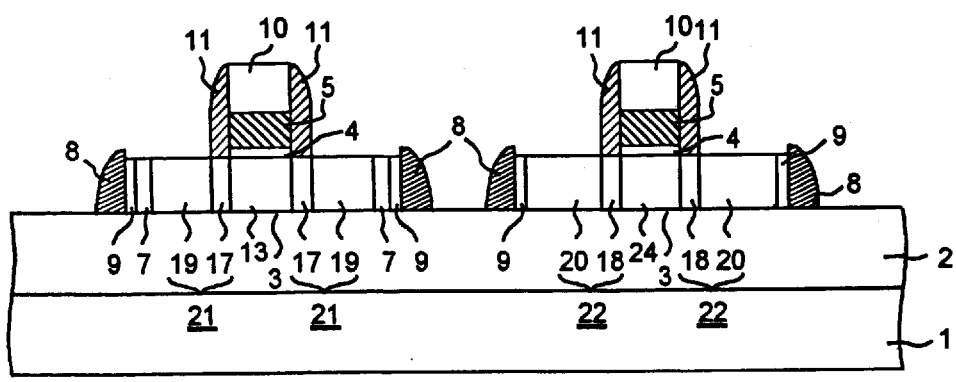

As shown in FIG. 12, N-type impurity ions and P-type impurity ions are next implanted into the N-channel transistor forming regions and the P-channel transistor forming regions, respectively, to form N-type and P-type high-concentration impurity regions 19 and 20 higher in impurity concentration than the N-type and P-type low-concentration impurity regions 17 and 18. Thus, N-type source/drain regions 21 of the N-channel transistor and P-type source/drain regions 22 of the P-channel transistor each having an LDD structure are formed. The region interposed between the source region and the drain region becomes one of channel regions 23 and 24 of the N-channel transistor and the P-channel transistor.

Thereafter, an interlayer insulating film 12 is stacked on the entire surface of the substrate, and contact holes reaching active regions including all the source/drain regions and all the gate electrodes are opened. Thereafter, the contact holes are filled with a conducting material to form contacts 13a, and wirings 13b are formed on the interlayer insulating film 12 so as to make contact with the contacts 13a, respectively. Thus, the semiconductor device shown in FIGS. 1 to 3 is obtained.

In the semiconductor device formed by the above method, the gate insulating film 4 and the conducting layer 5 are formed on the top surface of the SOI layer 3 before patterning the side surface of the SOI layer 3. Accordingly, the top surface of the SOI layer 3 is not subjected to an etching process, so that no etching damage is present on the top surface of the SOI layer 3. Further, the gate insulating film 4 is formed from an oxide film by deposition or an oxide film by thermal oxidation. Accordingly, as compared with the prior art in which a gate insulating film is formed by thermally oxidizing the top surface of an SOI layer which has undergone etching damage, the semiconductor device according to the present invention has an advantage in that the reliability of the gate insulating film 4 is higher such that a transistor having stable characteristics may be obtained.

In the prior art, electric field concentration occurs at an upper end portion of the SOI layer 3 as shown by the symbol A in FIG. 3 because of a short distance between the upper end portion of the SOI layer 3 and the gate electrode 10, causing current leakage between the source and drain electrodes. In contrast, according to the present invention, the conducting layer 5 is formed on the top surface of the SOI layer 3, so as to effectively act as a part of the gate electrode 10.

Further, the height of the sidewall 8 is made larger than the level of the top surface of the SOI layer 3, thereby suppressing a decrease in the distance between the upper end portion of the SOI layer 3 and the gate electrode 10 and maintaining a uniform distance between the surface of the gate electrode 10 facing the channel and the top surface of the SOI layer 3.

Accordingly, the electric field concentration can be suppressed to thereby suppress the current leakage between the source and drain electrodes, thus allowing stability of transistor characteristics.

It is to be noted that the above-mentioned manufacturing method is illustrative and various modifications regarding a film forming method, the kind of films to be used, etc. may be made provided to obtain the effect mentioned above.

Second Preferred Embodiment

Figure 13:
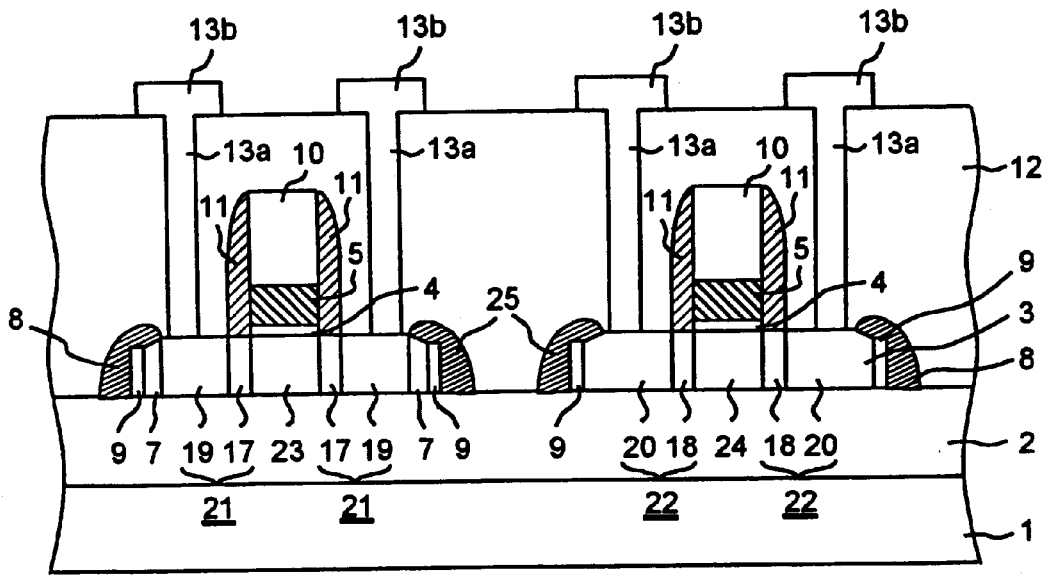
FIG. 13 shows a cross section view of a semiconductor device according to a second embodiment of this invention.
Figure 14:
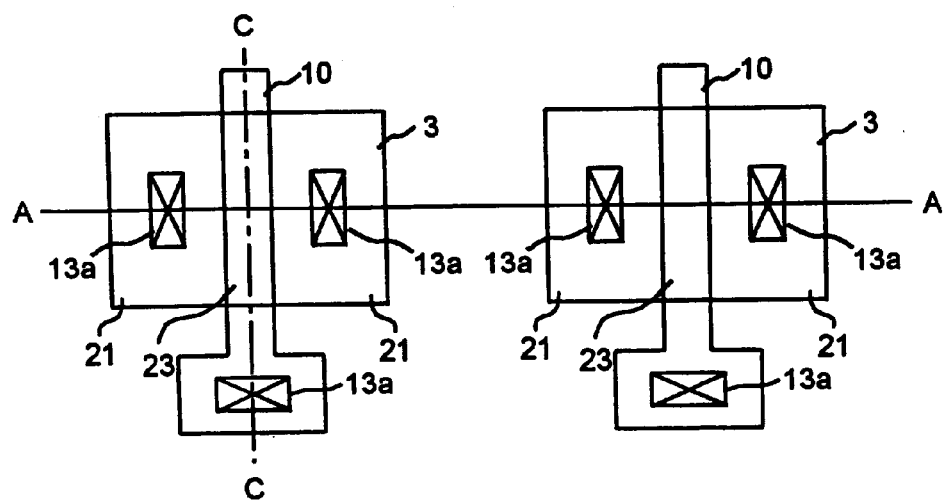
FIG. 14 shows a plan view of a semiconductor device according to a second embodiment of this invention.
Figure 15:
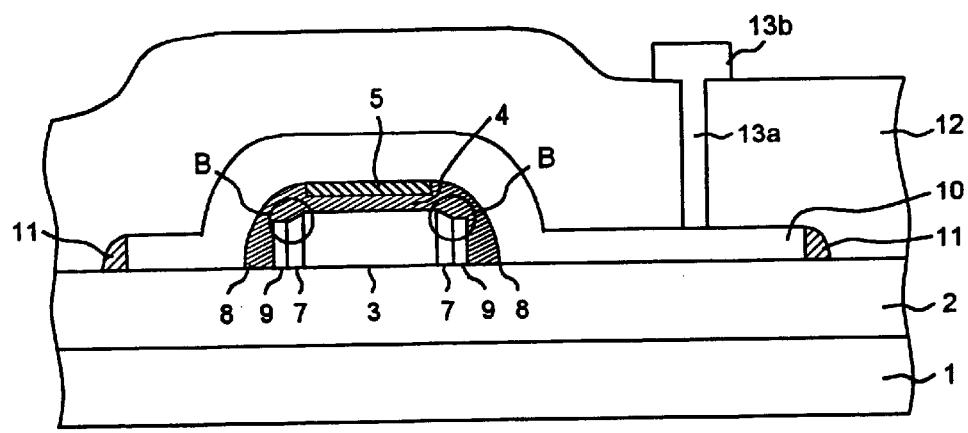
FIG. 15 shows a cross sectional view of a semiconductor device according to a second embodiment of this invention.

A second preferred embodiment of the present invention will now be described. FIGS. 13 to 15 show a semiconductor device according to the second preferred embodiment. FIG. 13 is a cross section of a mesa-isolation transistor having an SOI structure according to the second preferred embodiment, taken along a gate length of the transistor, and FIG. 14 is a top plan view of the transistor shown in FIG. 13. That is, FIG. 13 is a cross section taken along the line A—A in FIG. 14. FIG. 15 is a cross section taken along a direction perpendicular to the gate length, that is, a cross section taken along the line C—C in FIG. 14.

In these figures, the same reference numerals as those in the first preferred embodiment denote the same or corresponding parts. The second preferred embodiment is different from the first preferred embodiment in the shape of a sidewall 25 formed on the sectional side surface of an SOI layer 3.

A manufacturing method for the semiconductor device shown in FIGS. 13 to 15 will now be described.

Similar to the step shown in FIG. 4 of the first preferred embodiment, a buried oxide film 2 is formed on a silicon substrate 1, and an SOI layer 3 is formed on the buried oxide film 2. After forming the SOI layer 3, P-type impurities are implanted into a portion corresponding to a channel in an N-channel transistor forming region, and N-type impurities are implanted into a portion corresponding to a channel in a P-channel transistor forming region.

Figure 16:
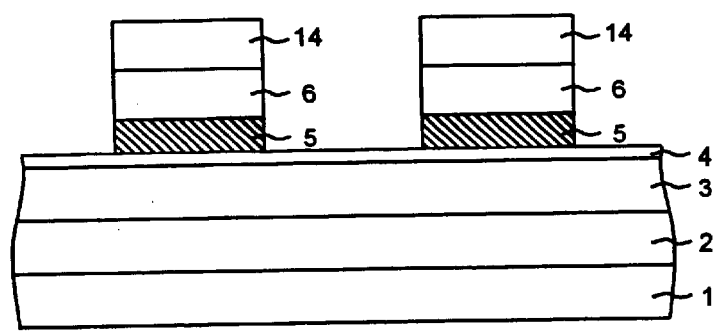
FIGS. 16–20 illustrate a method of manufacturing a semiconductor device according to a second embodiment of this invention.

As shown in FIG. 16, an oxide film 4 having a thickness of about 100 Å is next stacked on the SOI layer 3 by deposition of about 800° C. or by thermal oxidation at about 800° C. A conducting layer 5 of polysilicon having a thickness of about 200 Å is next stacked on the oxide film 4. A nitride film 6 having a thickness of 1000 Å is next deposited on the conducting layer 5 at a temperature of about 700° C. A resist pattern 14 is next formed on portions of the nitride film 6 corresponding to active regions by photolithography or the like. Thereafter, anisotropic etching is performed to sequentially pattern the nitride film 6 and the conducting layer 5 by using the resist pattern 14 as an etching mask.

Figure 17:
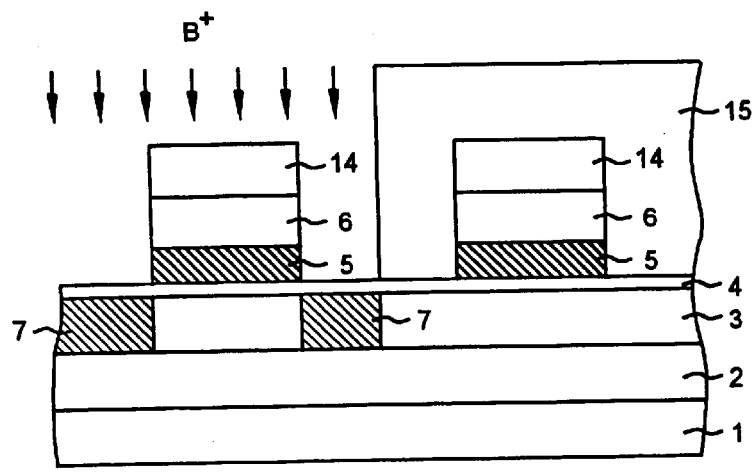

As shown in FIG. 17, a resist pattern 15 is next formed on regions other than the N-channel forming, and boron ions are then implanted with energies of 10–20 keV and doses of 3–15×10$^{13}$ cm$^{-2}$ by using the resist patterns 14 and 15 as a mask to thereby selectively form a P-type high-concentration impurity region 7 in the SOI layer 3. In this preferred embodiment, since the conducting layer 5 is also patterned like the nitride film 6 by anisotropic etching, the P-type high-concentration impurity region 7 is absent in the conducting layer 5.

Figure 18:
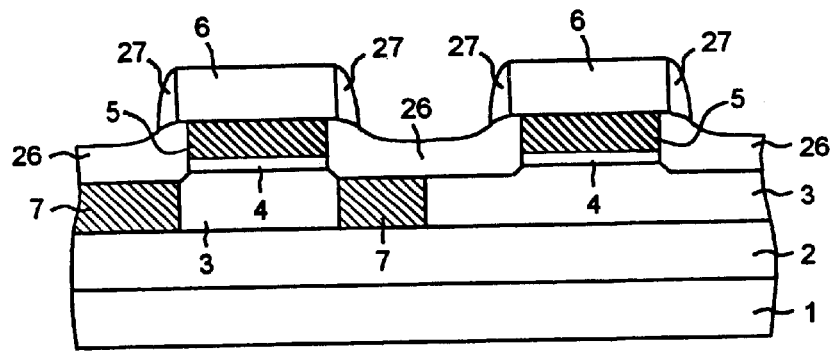

As shown in FIG. 18, the resist patterns 14 and 15 are next removed. Thereafter, oxidation is performed at a temperature of about 800° C. to oxidize the surfaces of the SOI layer 3 and the conducting layer 5, thereby forming an oxide film 26. Thereafter, a nitride film having a thickness of about 1000 Å is stacked, and anisotropic etching is next performed to form a sidewall 27 from this nitride film on the side surface of the nitride film 6 in a self-aligned manner.

Figure 19:
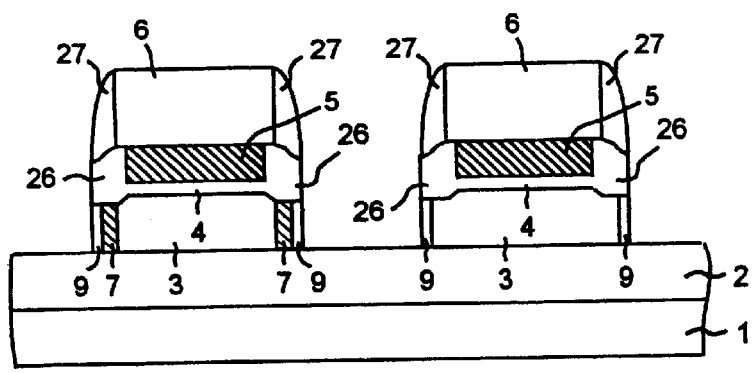

As shown in FIG. 19, anisotropic etching is next performed by using the nitride film 6 and the sidewall 27 of the nitride film as an etching mask to thereby pattern the gate insulating film 4 and the SOI layer 3.

Figure 20:
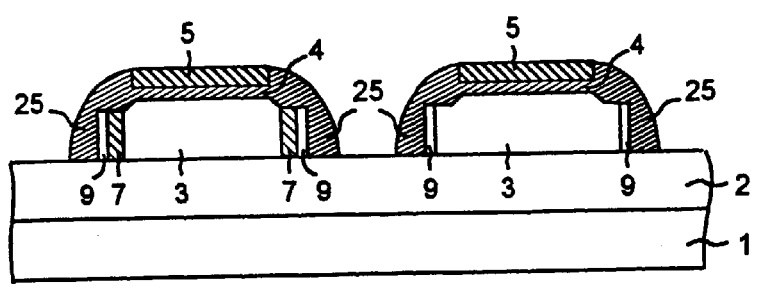

As shown in FIG. 20, the nitride film 6 and the sidewall 27 of the above nitride film are next removed by wet etching. Thereafter, oxidation is performed to form an oxide film 9 having a thickness of about 300 Å on the side surface of the SOI layer 3. Thereafter, an oxide film having a thickness of about 1500 Å is deposited, and anisotropic etching is performed to etch away this oxide film until the conducting layer 5 appears, thereby forming a sidewall 8 over the side surface of the SOI layer 3.

Thereafter, similar to the first preferred embodiment, source/drain regions 21 and 22, gate electrodes 10, contacts 13a, and wirings 13b are formed as shown in FIGS. 13 to 15. Thus, the semiconductor device as shown in FIGS. 13 to 15 is obtained. The formation of channel regions 23 and 24 in the SOI layer 3 may be performed by ion implantation before forming the gate electrodes 10.

In the semiconductor device formed by the above method, the insulating film 25 is formed between the gate electrode 10 and the SOI layer 3 at an upper edge portion of the SOI layer 3 as shown in a region shown by symbol B in FIG. 15. The insulating film 25 has a thickness sufficient to insulate the gate electrode 10 from the SOI layer 3, so that the current leakage between source and drain electrodes due to electric field concentration can be suppressed.

Furthermore, no etching damage is present on the top surface of the SOI layer 3. Accordingly, the reliability of the gate insulating film 4 formed by oxidizing the top surface of the SOI layer 3 can be made high to thereby obtain a semiconductor device having stable characteristics.

Third Preferred Embodiment

A third preferred embodiment of the present invention will now be described. The structure of a semiconductor device in this preferred embodiment is similar to the structure shown in FIGS. 13 to 15 of the second preferred embodiment. Further, in the figures of this preferred embodiment, the same reference numerals as those in the first and second preferred embodiments denote the same or corresponding parts.

Figure 21:
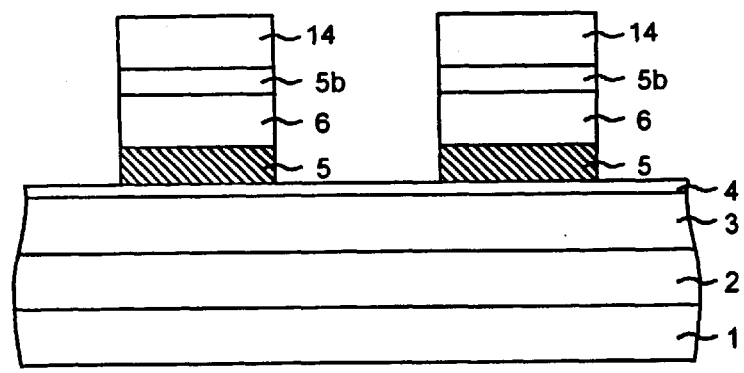
FIGS. 21–26 illustrate a method of manufacturing a semiconductor device according to a third embodiment of this invention.

Similar to the step shown in FIG. 4 of the first embodiment, a buried oxide film 2 is formed on a silicon substrate 1, and an SOI layer 3 is formed on the buried oxide film 2. Thereafter, P-type impurities are implanted into a portion of the SOI layer 3 corresponding to a channel in an N-channel transistor forming region, and N-type impurities are implanted into a portion of the SOI layer 3 corresponding to a channel in a P-channel transistor forming region, and impurity control is performed. As shown in FIG. 21, a gate insulating film 4 is next formed on the SOI layer 3 similar to the first and second preferred embodiments. Thereafter, a conducting layer 5, a nitride film 6, and a conducting layer 5b are sequentially stacked on the entire surface of the gate insulating film 4. The film thicknesses of the conducting layer 5 and the nitride film 6 are similar to those in the previous preferred embodiments, and the conducting layer 5b is formed of a conducting material such as polysilicon so as to have a thickness of about 200 Å similar to the conducting layer 5. A resist pattern 14 is next formed on portions of the conducting layer 5b corresponding to active regions, and anisotropic etching is performed by using the resist pattern 14 as an etching mask to thereby sequentially pattern the conducting layer Sb, the nitride film 6, and the conducting layer 5.

Figure 22:
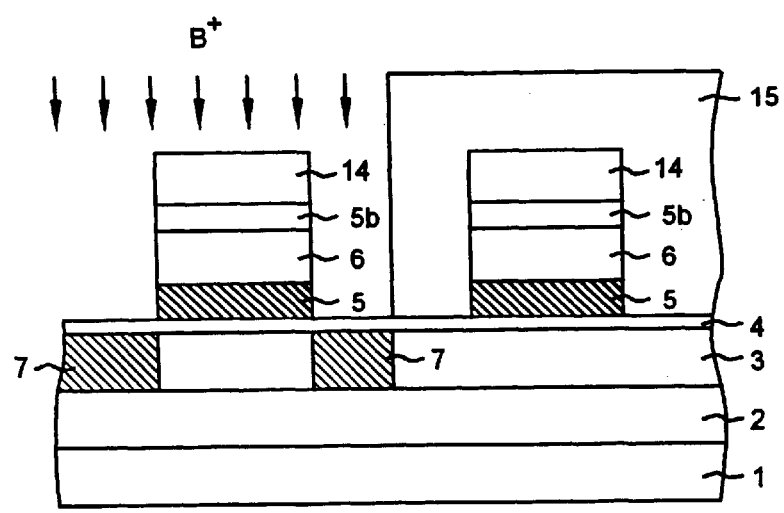

As shown in FIG. 22, a resist pattern 15 is next formed on regions other than the N-channel transistor forming region by photolithoraphy. Thereafter, boron ions are implanted with energies of 10–20 keV and doses of $3-15\times10^{13}$ cm$^{-2}$ by using the resist patterns 14 and 15 as a mask to thereby selectively form a P-type high-concentration impurity region 7 in the SOI layer 3. In this preferred embodiment, since the conducting layer 5 is also patterned like the nitride film 6 by anisotropic etching, the P-type high-concentration impurity region 7 is absent in the conducting layer 5.

Figure 23:
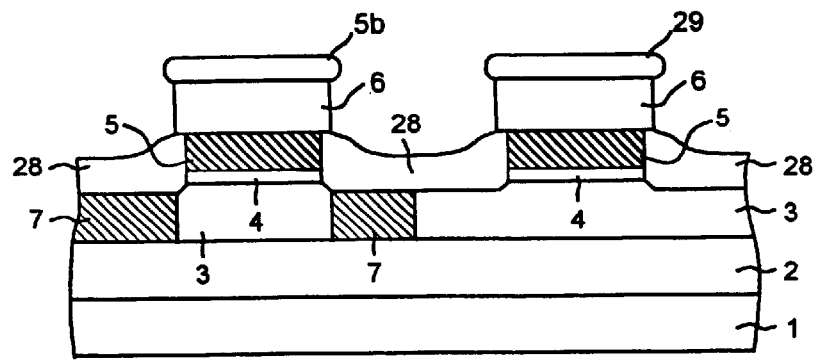

As shown in FIG. 23, the resist patterns 14 and 15 are next removed. Thereafter, thermal oxidation is performed to change an exposed portion of the conducting layer 5 into an oxide film 28 and to change the conducting layer 5b into an oxide film 29. At the same time, a part of the SOI layer 3 is also oxidized, and the gate insulating film 4 is changed into the thick oxide film 28.

Figure 24:
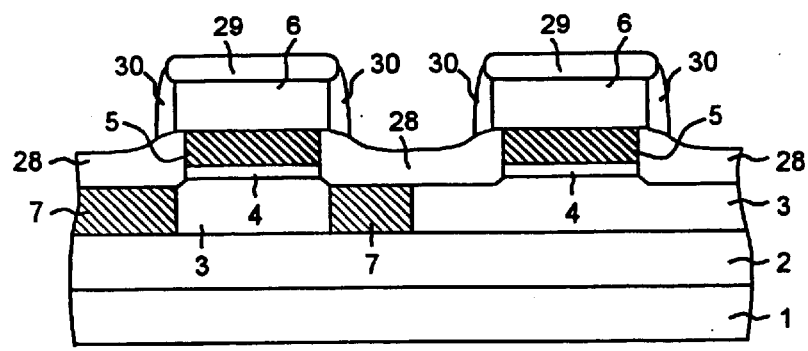

As shown in FIG. 24, a nitride film having a thickness of 1000 Å is deposited, and next anisotropic etching is performed to form a sidewall 30 of this nitride film on the side surface of the nitride film 6.

Figure 25:
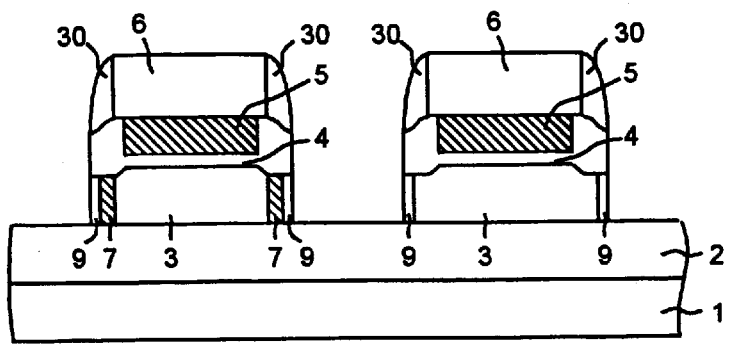

As shown in FIG. 25, anisotropic etching is next performed by using the nitride film 6 and the sidewall 30 of the nitride film as an etching mask to thereby sequentially pattern the oxide film 28 and the SOI layer 3 in accordance with the size of the mask. At the same time, the oxide film 29 is also etched away. Similar to the second preferred embodiment, the sectional side surface of the SOI layer 3 is next subjected to thermal oxidation to form an oxide film 9.

Figure 26:
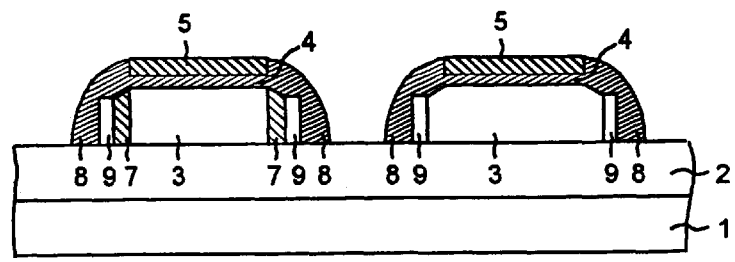

As shown in FIG. 26, the nitride film 6 and the sidewall 30 of the nitride film are next removed by wet etching. Thereafter, an oxide film having a thickness of 1500 Å is formed to form a sidewall 8 over the side surface of the SOI layer 3.

Although the impurity control for the channel is performed forming the SOI layer 3 and before the element isolation process as mentioned above, the impurity control for the channel may be performed after the element isolation process. Thereafter, a conducting film of the polysilicon having a thickness of 2000 Å is stacked over the whole surface of the substrate, and is then patterned to form gate electrodes 10 as is shown in FIGS. 13 to 15. Thereafter, as in the second preferred embodiment, source/drain regions 21 and 22, sidewalls 11, contacts 13a, and wirings 13b are sequentially formed to obtain a semiconductor device similar to that shown in FIGS. 13 to 15.

In the semiconductor device formed by the above method, the conducting layer 5b is formed on the nitride film 6 as shown in FIG. 21, thereby suppressing a damage to the nitride film 6 in forming the sidewall 30 from a nitride film. Furthermore, in performing the anisotropic etching of the SOI layer 3, the nitride film 6 does not undergo any damage, so that the etching mask can be formed accurately in size to allow accurate etching.

Further, since the complete structure of the semiconductor device according to the third preferred embodiment is quite similar to that of th e semiconductor device according to the second preferred embodiment, the other effects similar to those of the second preferred embodiment can be obtained, and the description thereof will be omitted to avoid repetition.

Fourth Preferred Embodiment

A fourth preferred embodiment of the present invention will now be described. A manufacturing method for a semiconductor device according to th e fourth preferred embodiment is characterized in that the formation of the P-type high-concentration impurity region 7 in the SOI layer 3 in the N-channel transistor forming region for the purpose of suppressing the current leakage between the source and drain electrodes occurring at the upper end portion of the SOI layer 3 is performed by rotary implantation after forming the nitride film 6. The structure of the semiconductor device finally obtained in this preferred embodiment is similar to that shown in FIGS. 1 to 3 of the first preferred embodiment.

Figure 27:
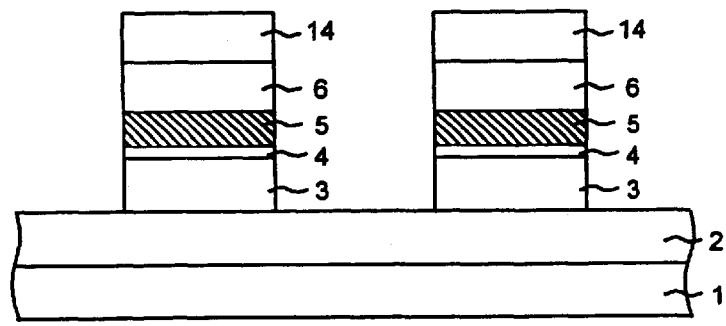
FIGS. 27–29 illustrate a method of manufacturing a semiconductor device according to a fourth embodiment of this invention.

T he manufacturing method for the semiconductor device according to this preferred embodiment will now be described. As shown in FIG. 4 of the first preferred embodiment, a buried oxide film 2 and an SOI layer 3 are sequentially formed on the upper surface of a silicon substrate 1. As shown in FIG. 27, a gate insulating film 4 having a thickness of 100 Å, a conducting layer 5 having a thickness of 200 Å, and a nitride film 6 having a thickness of 2000 Å are sequentially stacked on the SIO layer 3. A resist pattern 14 having a certain shape is next formed on the nitride film 6 by photolithography. Thereafter, anisotropic etching is performed by using the resist pattern 14 as an etching mask to sequentially pattern the nitride film 6, the conducting layer 5, the gate insulating film 4, and the SOI layer 3.

Figure 28:
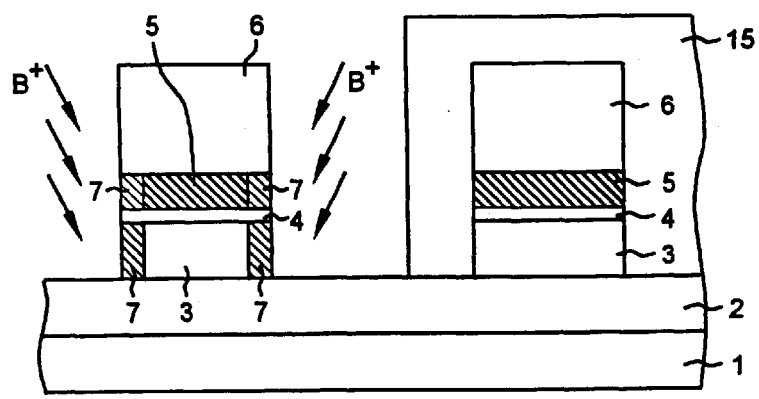

Thereafter, the resist pattern 14 is removed, and a resist pattern 15 is next formed so as to expose only an N-channel transistor forming region. As shown in FIG. 28, boron ions are next implanted by rotating implantation with energies of 30–40 keV and doses of $3-15\times10^{13}$ cm$^{-2}$ to thereby form a P-type high-concentration impurity region 7 for suppressing the current leakage between source and drain electrodes on the side surface of the SOI layer 3 in the N-channel transistor forming region. This process of rotating implantation to form the P-type high-concentration impurity region 7 has an advantage in that a similar structure can be obtained with a reduced number of steps over the process of the first to third preferred embodiments wherein boron ions are first implanted in the direction vertical to a main surface of the silicon substrate 1 to form the P-type high-concentration impurity region is next etched away leaving an area adjacent to the side surface of the SOI layer 3 with a given lateral width.

Thereafter, the resist pattern 15 is removed, and thermal oxidation is next performed to change the side surface of the SOI layer 3 with etching damage into an oxide film 9, thereby suppressing current leakage from defects. This oxidation of the side surface of the SOI layer 3 may be performed before forming the P-type high-concentration impurity region 7.

Figure 29:
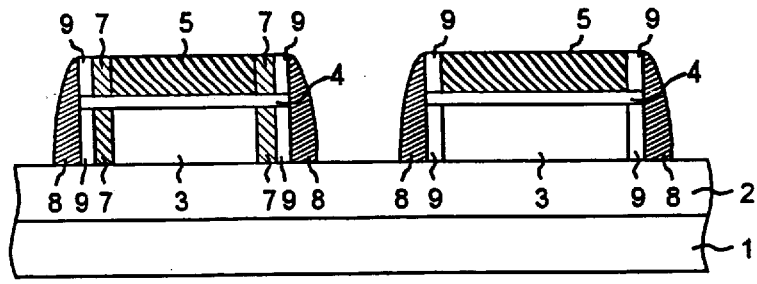
Figure 30:
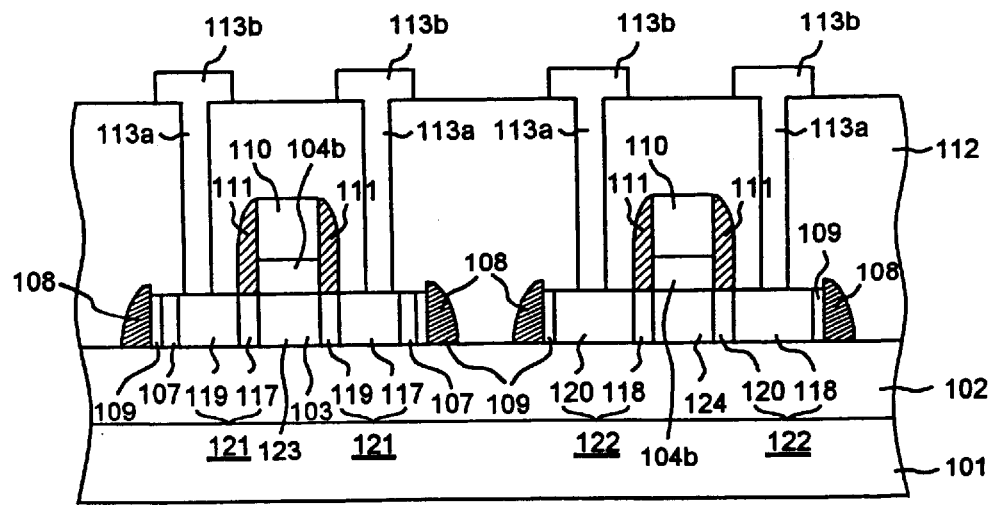
FIG. 30 shows a cross sectional view of a conventional semiconductor device.
Figure 31:
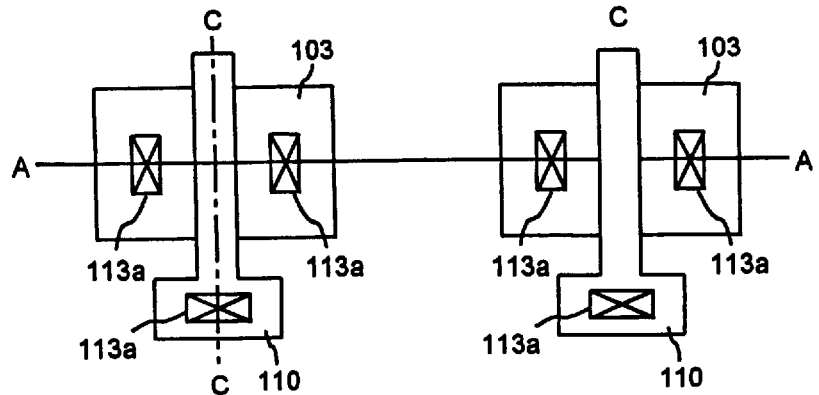
FIG. 31 shows a cross sectional view of a conventional semiconductor device.
Figure 32:
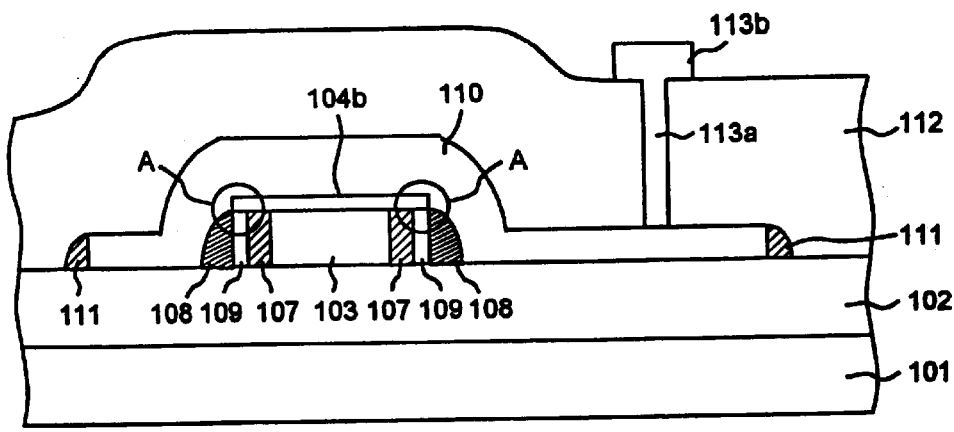
FIGS. 32–37 illustrate a conventional method of manufacturing a semiconductor device.
Figure 33:
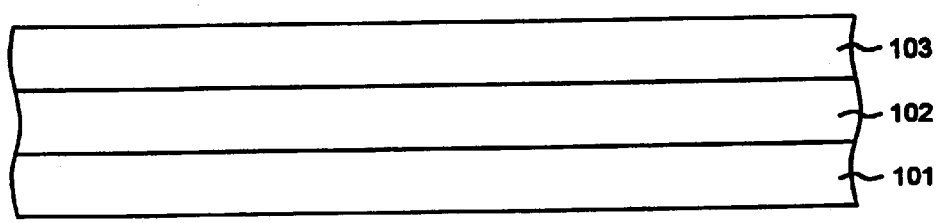
Figure 34:
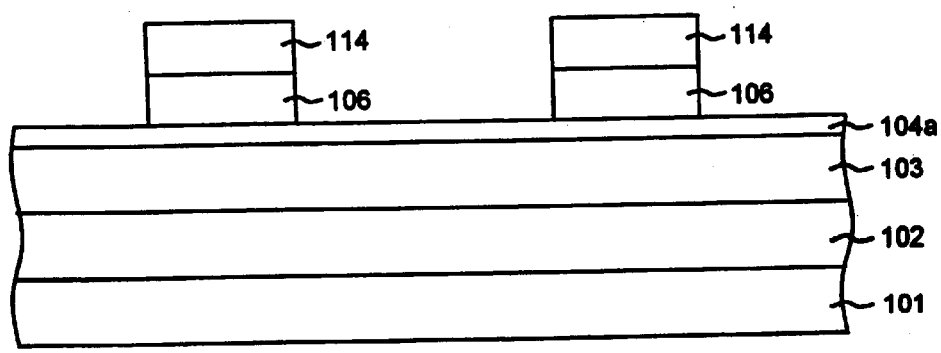
Figure 35:
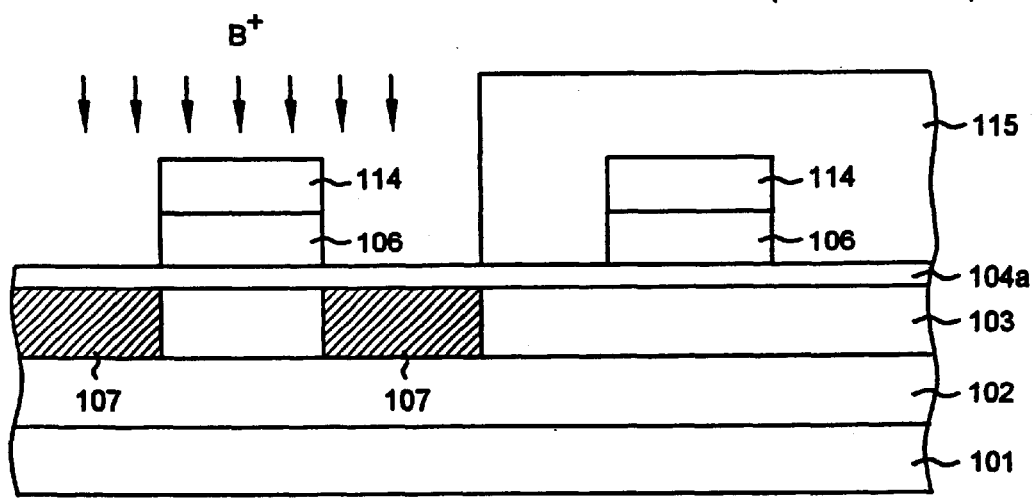
Figure 36:
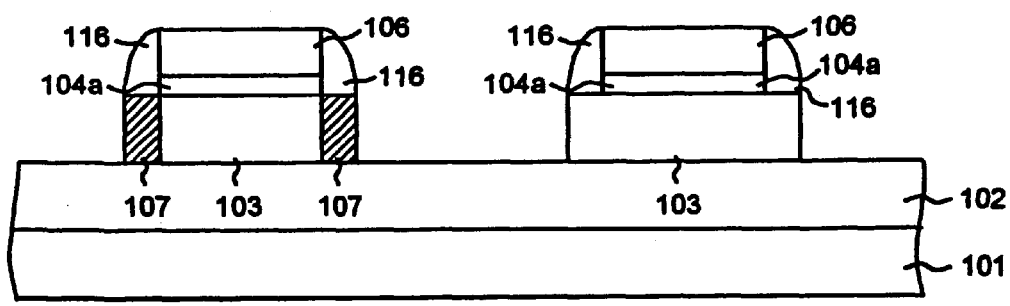
Figure 37:
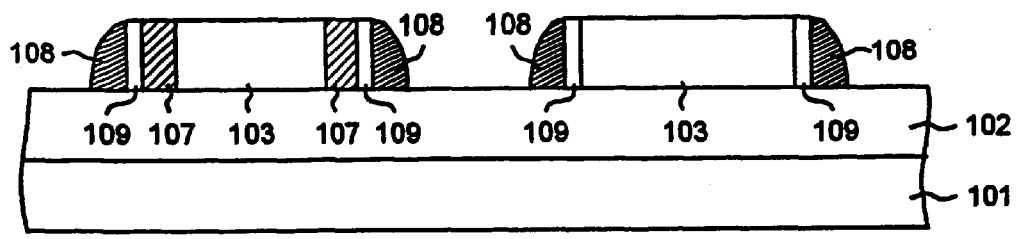

Thereafter, the nitride film 6 is removed, and an oxide film having a thickness of 1500 Å is next stacked. Then, anisotropic etching is performed to form a sidewall 8 from this oxide film as shown FIG. 29. The subsequent steps are performed as in the first preferred embodiment to obtain a semiconductor device similar in structure to the semiconductor device shown in FIGS. 1 to 3.

According to the manufacturing method of the fourth preferred embodiment, it is unnecessary to deposit a sidewall of a nitride film on the nitride film 6 serving as an etching mask in patterning the SIO layer 3 in the N-channel transistor forming region with a part of the P-type high-concentration impurity region 7 remaining in the SOI layer 3. Therefore, a semiconductor device similar to that of the first preferred embodiment can be obtained with a reduced number of steps.

Obviously, numerous additional modifications and variations of the present invention are possible in light of the above teachings. It is therefore to be understood that within the scope of the appended claims, the present invention may be practiced otherwise than as specifically described herein.

What is claimed is:

1. A method of manufacturing a semiconductor device, comprising the steps of:

sequentially stacking an SOI layer, a gate insulating film, and a conducting layer, each having a predetermined thickness and the same surface area, on an insulating film;

performing anisotropic etching of said SOI layer, said gate insulating film, and said conducting layer by using a predetermined mask pattern;

oxidizing side surfaces of at least said SOI layer and said conducting layer;

removing said mask pattern;

depositing an insulating material on said insulating film and performing anisotropic etching to form a sidewall on said oxidized side surfaces of said SOI layer and said conducting layer; and forming a gate electrode in contact with said conducting layer.

2. A method of manufacturing a semiconductor device, comprising the steps of:

sequentially stacking an SOI layer, a gate insulating film, a conducting layer, and a nitride film, each having a predetermined thickness and the same surface area, on an insulating film;

performing anisotropic etching of said nitride film and said conducting layer by using a predetermined mask pattern;

selectively oxidizing at least said SOI layer and said conducting layer;

forming a first sidewall of nitride film on a side surface of at least said nitride film;

performing anisotropic etching of said gate insulating film and said SOI layer by using said nitride film and said first sidewall as an etching mask;

oxidizing a side surface of said SOI layer;

etching away said nitride film and said first sidewall;

depositing an insulating material on said insulating film and performing anisotropic etching to form a second sidewall on said side surface of said SOI layer and a side surface of said conducting layer; and forming a gate electrode in contact with said conducting layer.

3. A method of manufacturing a semiconductor device, comprising the steps of:

sequentially stacking an SOI layer, a gate insulating film, a first conducting layer, a nitride film, and a second conducting layer, each having a predetermined thickness and the same surface area, on an insulating film;

performing anisotropic etching of said first conducting layer, said nitride film, and said second conducting layer by using a predetermined mask pattern;

selectively oxidizing at least said SOI layer, said first conducting layer, and said second conducting layer;

forming a first sidewall of nitride film on a side surface of at least said nitride film;

performing anisotropic etching of said second conducting layer, said gate insulating film, and said SOI layer by using said nitride film and said first sidewall as an etching mask;

oxidizing a side surface of said SOI layer;

etching away said nitride film and said first sidewall;

depositing an insulating material on said insulating film and performing anisotropic etching to form a second sidewall on said side surface of said SOI layer and a side surface of said first conducting layer; and forming a gate electrode in contact with said first conducting layer.

4. The method as set forth in claim 1, wherein the forming step comprises forming the gate electrode with a part on the insulating film and a remaining part on the conductive layer.

5. The method as set forth in claim 1, wherein the forming step comprises forming the gate electrode with a part with a length in a width direction of the device that is shorter than a length of the gate insulating film in the width direction of the device.

6. The method as set forth in claim 1, further comprising forming a channel region and source/drain regions in the SOI layer.

7. The method as set forth in claim 6, wherein the step of forming the channel region and the source/drain regions comprises forming the gate electrode a part on the channel region with a thickness that is greater than a thickness of another part of the gate electrode that is outside the channel region.

8. The method as set forth in claim 2, wherein the forming step comprises forming the gate electrode with a part on the insulating film and a remaining part on the conductive layer.

9. The method as set forth in claim 2, wherein the forming step comprises forming the gate electrode with a part with a length in a width direction of the device that is shorter than a length of the gate insulating film in the width direction of the device.

10. The method as set forth in claim 2, further comprising forming a channel region and source/drain regions in the SOI layer.

11. The method as set forth in claim 10, wherein the step of forming the channel region and the source/drain regions comprises forming the gate electrode with a part on the channel region with a thickness that is greater than a thickness of another part of the gate electrode that is outside the channel region.

12. The method as set forth in claim 3, wherein the forming step comprises forming the gate electrode with a part on the insulating film and a remaining part on the conductive layer.

13. The method as set forth in claim 3, wherein the forming step comprises forming the gate electrode with a part with a length in a width direction of the device that is shorter than a length of the gate insulating film in the width direction of the device.

14. The method as set forth in claim 3, further comprising forming a channel region and source/drain regions in the SOI layer.

15. The method as set forth in claim 14, wherein the step of forming the channel region and the source/drain regions comprises forming the gate electrode with a part on the channel region with a thickness that is greater than a thickness of another part of the gate electrode that is outside the channel region.

16. A method of manufacturing a semiconductor device, comprising the steps of:
   sequentially stacking a first insulating film and a polysilicon layer on an SOI layer on a second insulating film;
   patterning said polysilicon layer, said first insulating film, and said SOI layer by using a predetermined mask pattern;
   oxidizing side surfaces of at least said SOI layer and said polysilicon layer;
   removing said mask pattern;
   forming a third insulating film on said second insulating film and forming a sidewall on said oxidized side surfaces of said SOI layer and said polysilicon layer; and
   forming a gate electrode in contact with said polysilicon layer.

17. A method of manufacturing a semiconductor device, comprising the steps of:
   sequentially stacking a first insulting film, a polysilicon layer and a nitride film on an SOI layer on a second insulating film;
   patterning said nitride film and said polysilicon layer by using a predetermined mask pattern;
   selectively oxidizing at least said SOI layer and said polysilicon layer;
   forming a first sidewall of nitride film on a side surface of at least said nitride film;
   patterning said first insulating film and said SOI layer by using said nitride film and said first sidewall as an etching mask;
   oxidizing a side surface of said SOI layer;
   removing said nitride film and said first sidewall;
   forming a third insulating film on said second insulating film and forming a second sidewall on said side surfaces of said SOI layer and a side surface of said polysilicon layer; and
   forming a gate electrode in contact with said polysilicon layer.

18. A method of manufacturing a semiconductor device, comprising the steps of:
   sequentially stacking a first insulting film, a polysilicon layer, a nitride film, and a second polysilicon layer on an SOI layer on a second insulating film;
   patterning said second polysilicon layers, said nitride film, and said first polysilicon layer by using a predetermined mask pattern;
   selectively oxidizing at least said SOI layer, said first polysilicon layer, and said second polysilicon layer;
   forming a first sidewall of nitride film on a side surface of at least said nitride film;
   etching said second polysilicon layer, said first insulating film, and said SOI layer by using said nitride film and said first sidewall as an etching mask;
   oxidizing a side surface of said SOI layer;
   removing said nitride film and said first sidewall;
   forming a third insulating film on said second insulating film and forming a second sidewall on said side surfaces of said SOI layer and a side surface of said first polysilicon layer; and
   forming a gate electrode in contact with said polysilicon layer.

* * * * *